(12) United States Patent
Nishiyama et al.

(10) Patent No.: US 11,774,525 B2
(45) Date of Patent: Oct. 3, 2023

(54) NMR PROBE

(71) Applicant: JEOL Ltd., Tokyo (JP)

(72) Inventors: Masahide Nishiyama, Tokyo (JP); Yuki Endo, Tokyo (JP); Hiroki Takahashi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/693,841

(22) Filed: Mar. 14, 2022

(65) Prior Publication Data

US 2022/0299585 A1    Sep. 22, 2022

(30) Foreign Application Priority Data

Mar. 18, 2021 (JP) .................... 2021-044962

(51) Int. Cl.
*G01R 33/30* (2006.01)
(52) U.S. Cl.
CPC .................. *G01R 33/307* (2013.01)
(58) Field of Classification Search
CPC .................................................... G01R 33/307
See application file for complete search history.

(56) References Cited

U.S. PATENT DOCUMENTS

| | | | |
|---|---|---|---|
| 7,282,919 B2 * | 10/2007 | Doty | G01R 33/307 324/321 |
| 2006/0176056 A1 | 8/2006 | Doty et al. | |
| 2010/0109666 A1 | 5/2010 | Armbruster et al. | |
| 2013/0207656 A1 * | 8/2013 | Shinagawa | G01R 33/30 324/321 |
| 2014/0125340 A1 | 5/2014 | Hunkeler et al. | |
| 2018/0259602 A1 | 9/2018 | Endo et al. | |
| 2019/0242958 A1 | 8/2019 | Krahn et al. | |

FOREIGN PATENT DOCUMENTS

| | | |
|---|---|---|
| JP | 2013167463 A | 8/2013 |
| JP | 2014149291 A | 8/2014 |
| JP | 5875610 B2 | 1/2016 |
| JP | 6016373 B2 | 10/2016 |
| JP | 2018146445 A | 9/2018 |

OTHER PUBLICATIONS

Extended European Search Report issued in EP22161382.1 dated Jul. 22, 2022.
Office Action issued in JP2021044962 dated Apr. 18, 2023.
Communication pursuant to Article 94(3) issued in EP22161382.1 dated Jun. 30, 2023.

* cited by examiner

*Primary Examiner* — G. M. A Hyder
(74) *Attorney, Agent, or Firm* — THE WEBB LAW FIRM

(57) ABSTRACT

A direction shifting mechanism for changing a direction of a sample tube is installed on a path of the sample tube between a sample tube supporting unit for supporting, during an NMR measurement, the sample tube used for the NMR measurement and an insertion port through which the sample tube is inserted in and extracted from the sample tube supporting unit. The direction shifting mechanism has a shape which partially includes a form of an arc, and the shape is designed to cause the sample tube to change its direction in such a manner that the sample tube is turned toward the insertion port along the arc while being maintained in contact with at least two points on an inner wall of the direction shifting mechanism.

5 Claims, 7 Drawing Sheets

NMR PROBE

CROSS REFERENCE TO RELATED APPLICATION

This application claims priority to Japanese Patent Application No. 2021-044962 filed Mar. 18, 2021, the disclosure of which is hereby incorporated by reference in its entirety.

BACKGROUND OF THE INVENTION

Field of the Invention

The present disclosure relates to an NMR probe used for nuclear magnetic resonance (NMR) measurement, and, in particular, to a technique for extracting a sample tube from an NMR probe.

Description of Related Art

A nuclear magnetic resonance (NMR) apparatus is an instrument for applying a static magnetic field to atomic nuclei having spin magnetic moments to induce Larmor precession of the spin magnetic moments, and further applying a high frequency wave having the same frequency as the frequency of the induced Larmor precession to produce resonance, and detecting a signal from atomic nuclei having resonated spin magnetic moments.

For NMR measurement of solid samples, a magic angle spinning (MAS) method is generally employed. In the MAS method, a sample tube containing a solid sample is rotated at high speed in a state where the sample tube is inclined at a magic angle (of approximately 54.7°) relative to a direction of a static magnetic field, and in this state, an NMR signal is detected.

When the NMR measurement is conducted using an NMR probe for implementing the MAS method, the NMR probe is inserted into a measurement space formed in the shape of a narrow slot in a magnetic field generator which is typically composed of a superconductive magnet. In an MAS probe, the sample tube containing the solid sample is placed in a sample tube supporting unit in a state where the sample tube is inclined at the magic angle relative to the magnetic field. The sample tube supporting unit for supporting the sample tube during a measurement is configured to precisely regulate the position and movement of the sample tube.

A solid-state NMR probe used for solid samples is inserted into a bore from therebelow that is defined at the center of the magnetic field generator composed of the superconductive magnet, for example, the bore being at room temperature, and is secured by means of a screw, for example. When securing the sample tube, the sample tube must be placed precisely at the center of a magnetic field created by the magnetic field generator. In the above-described NMR apparatus, the NMR probe must, in general, be dismounted from the magnetic field generator in order to replace samples. Tasks of, for example, dismounting the NMR probe, which is made of metal and is thus heavy, from the magnetic field generator and steadily handling the heavy NMR probe impose a great load on an operator. Further, after dismounting the NMR probe from the magnetic field generator, it becomes necessary for the sample tube to be inserted into the NMR probe, the NMR probe to be reinstalled in the bore of the magnetic field generator, and, after reinstalling the NMR probe, preparations for a subsequent measurement to be performed in order to conduct the subsequent measurement. In such a manner of dismounting the NMR probe from the magnetic field generator, replacement of samples is time consuming and labor intensive work, and is thus burdensome to the operator.

In addition to the above-described manner of dismounting the NMR probe from the magnetic field generator to replace the sample tube, there is another known manner, in which the sample tube is extracted through the bore having room temperature from the magnetic field generator to the outside thereof while maintaining the NMR probe installed in the magnetic field generator. As a method for extracting the sample tube from the solid-state NMR probe, for example, it has been known that gas is injected toward the sample tube from behind the sample tube in order to push the sample tube toward the outside of the NMR probe. Further, another method for extracting the sample tube from the NMR probe to the outside has been known, in which gas is injected from above the NMR probe into the inside thereof in order to eject the sample tube toward the outside of the NMR probe.

Because the sample tube is placed in the state inclined at the magic angle as described above, an orientation of the sample tube inclined at the magic angle must be changed, for extraction of the sample tube from the NMR probe, so as to be moved along an extraction direction (for example, a vertical direction) in which the sample tube is extracted from the NMR probe (i.e., so as to be moved toward an insertion port for inserting and extracting the sample tube in and from the NMR probe). To achieve this, the NMR probe must include, in its inside, a space for changing the orientation of the sample tube (the orientation of the sample tube may be referred to as a position of the sample tube). In general, a sample tube for the solid state NMR probe has a total length of approximately 20 mm, and the above described extraction methods are applied to an NMR probe having a large outer diameter of approximately 70 mm, for example (such a large diameter NMR probe may in some cases be referred to as a wide bore probe).

On the other hand, an NMR probe whose outer diameter is small (that may be referred to as a narrow bore probe) has spatial constraints, and is therefore unable to include any additional space for changing the orientation of the sample tube within the NMR probe. For this reason, in a case where the NMR probe having a small outer diameter is utilized, the NMR probe itself must be dismounted from the NMR apparatus, in order to extract the sample tube from the NMR probe.

Meanwhile, as a mechanism for changing the orientation of the sample, there has been known an arrangement in which the sample tube supporting unit is vertically placed when the sample tube is extracted. In this arrangement, the sample tube is inserted into and extracted from the vertically placed sample tube supporting unit. At the time of measurement, the sample tube supporting unit is inclined at the magic angle. For the arrangement, there must be devised a mechanism for maintaining an angle of inclination of the sample tube supporting unit at the magic angle after the sample tube is replaced, for example.

An arrangement for extracting a sample tube from an NMR probe is disclosed in JP 6,016,373 B (hereinafter referred to as the '373 patent) and JP 5,875,610 B (hereinafter referred to as the '610 patent). In the NMR probe described in the '373 patent, a space for changing the orientation of the sample tube is formed, and the orientation of the sample tube is changed by injecting gas into the space, to thereby extract the sample tube from the NMR probe. In the '610 patent, the orientation of the sample tub is changed by controlling a supplied pressure.

The present disclosure is directed to reduce the size of a space necessary for extracting a sample tube from an NMR probe.

SUMMARY OF THE INVENTION

In an aspect of this disclosure, an NMR probe is provided, the NMR probe including a sample tube supporting unit configured to support, during an NMR measurement, a sample tube for the NMR measurement, an insertion port through which the sample tube is introduced into or extracted from the sample tube supporting unit, and a direction shifting mechanism disposed between the sample tube supporting unit and the insertion port in a path of the sample tube, the direction shifting mechanism having a shape which partially includes a form of an arc, the direction shifting mechanism being configured to pass therethrough the sample tube, in which the shape of the direction shifting mechanism is designed to cause the sample tube to change its orientation in such a manner that the sample tube is turned toward the insertion port along the arc while being maintained in contact with at least two points on an inner wall of the direction shifting mechanism when the sample tube is directed from the sample tube supporting unit to the insertion port and extracted therefrom.

In the above-described configuration, the inner wall of the direction shifting mechanism has a shape which partially includes the form of the arc. In operation to extract the sample tube from the NMR probe, the sample tube is turned toward the insertion port along the arc while being maintained in contact with the at least two points on the inner wall of the direction shifting mechanism. That is, the sample tube is turned toward the insertion port along the arc in a state where at least two points on the sample tube are brought into contact with the inner wall of the direction shifting mechanism. In this way, a space needed to change a direction of the sample tube can be minimized. For example, when the insertion port is disposed on an upper part of the NMR apparatus, the direction of the sample tube is shifted to a vertical direction. The above-described configuration can allow extraction of the sample tube without employing a conventional method in the related art (such as, for example, a method for changing an orientation of a sample tube supporting unit). Therefore, there is no need to install a mechanism for implementing the conventional method.

The above-described NMR probe may further include a device configured to draw the sample tube by suction from the sample tube supporting unit toward the insertion port for extracting the sample tube from the insertion port.

For example, a device for creating a negative pressure (such as, for example, a pump, a buffer tank, or a venturi pump) may be connected to the insertion port, to suck the sample tube with the device. In this way, the sample tube can be transferred by suction from the sample tube supporting unit to the insertion port and extracted from the insertion port. When the sample tube is sucked from an insertion port side as described above, the direction of the sample tube can be changed without causing a tip end of the sample tube (i.e., an end located forward in a moving direction of the sample tube) to collide against the inner wall of the direction shifting mechanism in the course of extraction of the sample tube. As a result, the tip end (such as, for example, a region where a turbine blade is formed) of the sample tube can be protected from getting damaged due to collision with the inner wall.

The sample tube supporting unit is configured to support the sample tube in a state of being inclined at a magic angle relative to a static magnetic field, and the form of the arc may include a part of a transformed astroid which is fitted to the magic angle. The form of the arc may include a part of a circle approximated to an astroid.

The insertion port may be arranged at a location shifted toward the sample tube supporting unit from a location of a front end of the sample tube which is completely extracted from the sample tube supporting unit.

The direction shifting mechanism and the sample tube supporting unit may be installed without being connected to each other, to thereby form a gap between the direction shifting mechanism and the sample tube supporting unit.

According to the present disclosure, the space needed to extract the sample tube from the NMR probe can be minimized in size.

BRIEF DESCRIPTION OF DRAWINGS

Embodiments of the present disclosure will be described based on the following figures, wherein.

DESCRIPTION OF THE INVENTION

Figure 1:
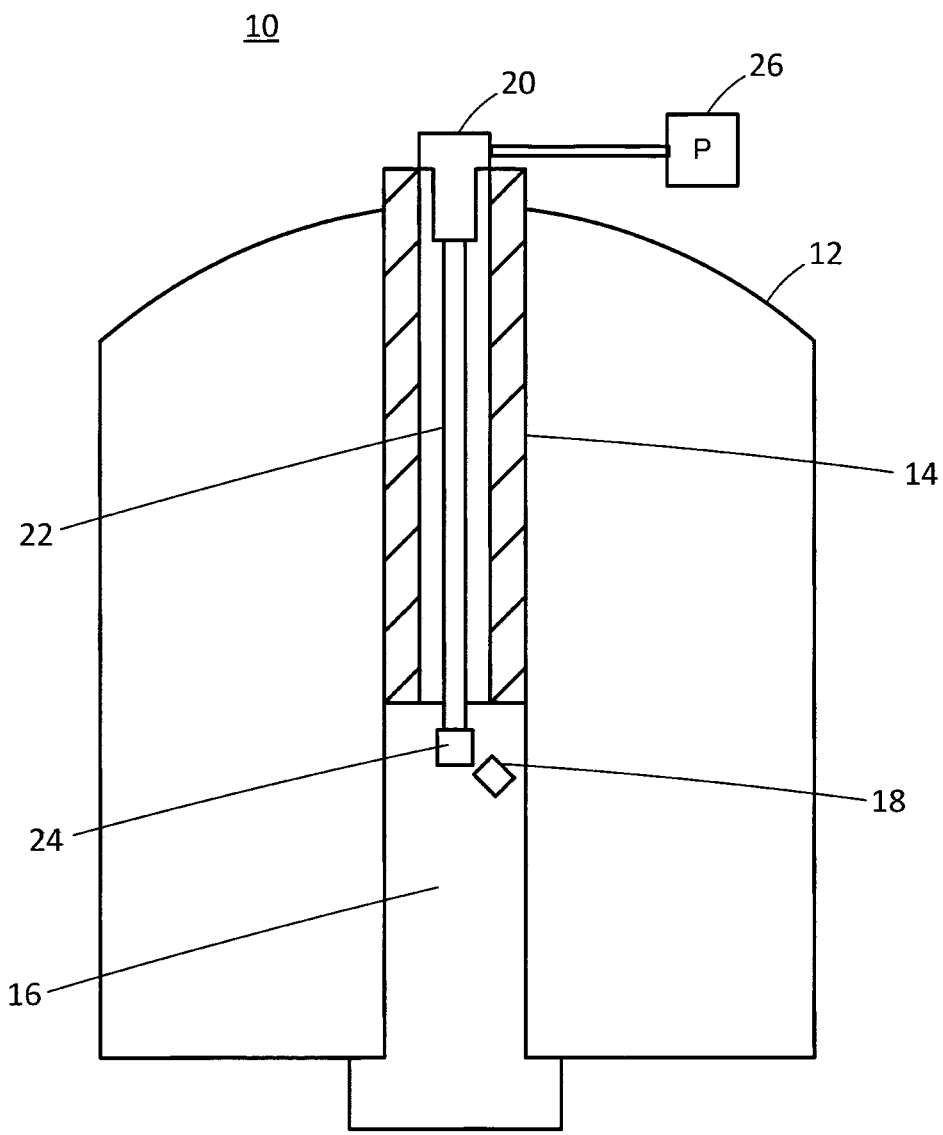
FIG. 1 shows an NMR apparatus according to an embodiment.
Figure 2:
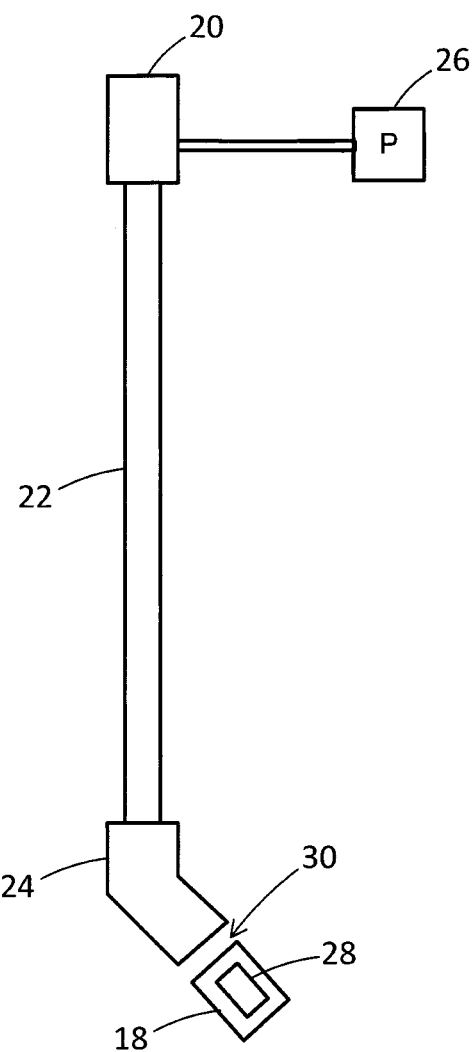
FIG. 2 shows an NMR probe according to the embodiment.

FIG. 1 shows an example of an NMR apparatus according to an embodiment. FIG. 2 shows an example of an NMR probe according to the embodiment. An NMR apparatus 10 is an instrument for measuring an NMR signal arising from nuclei to be observed in a sample.

A static magnetic field generator 12 is a device for producing a static magnetic field, and a bore 14 is formed as a cavity extending along a vertical direction in a central region of the static magnetic field generator 12. An NMR probe 16 is generally formed in a cylindrical shape extending in the vertical direction, and is configured to be inserted into the bore 14 of the static magnetic field generator 12. The NMR probe 16 according to this embodiment is a device implementing an MAS method, and includes a sample tube supporting unit 18, an insertion port 20 disposed at a top end of the bore 14, a sample tube passage pipe 22 disposed between the insertion port 20 and the sample tube supporting device 18 to form a path through which a sample tube 28 is transferred, a direction shifting mechanism 24 disposed between the sample tube passage pipe 22 and the sample tube supporting unit 18, and detection coils for transmission and reception. The sample tube supporting unit 18 is a device for supporting the sample tube 28 in a state where the sample tube 28 is inclined at a magic angle. A negative pressure generator 26 is connected to the insertion port 20. The negative pressure generator 28 is composed, for example, of a pump, a buffer tank, a venturi pump, or the like. The sample tube 28 has, for example, a cylindrical shape designed to house a solid sample. The sample tube 28 is supported at its circumference by a precision gas bearing and is rotated about an axis of rotation which is inclined at the magic angle relative to the static magnetic field at high speed during a measurement.

The sample tube passage pipe 22 and the direction shifting mechanism 24 are hollow passages constituting the path of the sample tube 28 from the sample tube supporting unit 18 to the insertion port 20. The sample tube passage pipe 22 vertically extends along the bore 14, and the direction shifting mechanism 24 is configured to change an orientation of the sample tube 28 which is transferred through the passages. Specifically, when the sample tube 28 is introduced from the insertion port 20 into the sample tube passage pipe 22, the direction shifting mechanism 24 shifts a direction of a cylinder axis of the introduced sample tube 28 to a direction (i.e., changes the orientation of the sample tube 28 to an orientation) parallel to the axis of rotation of the sample tube supporting unit 18, and subsequently directs the sample tube 28 into the sample tube supporting unit 18. On the other hand, when the sample tube 28 is ejected from the sample tube supporting unit 18, the direction shifting mechanism 24 shifts the direction of the cylinder axis of the sample tube 28 to turn the sample tube 28 toward the insertion port 20. That is, the direction shifting mechanism 24 shifts the direction of the cylinder axis of the sample tube 28, for example, to the vertical direction. The sample tube 28 is bidirectionally movable between the insertion port 20 and the sample tube supporting unit 18 through the sample tube passage pipe 22 and the direction shifting mechanism 24.

As shown in FIG. 2, the direction shifting mechanism 24 is connected to an end of the sample tube passage pipe 22 opposite to the insertion port 20. The direction shifting mechanism 24 and the sample tube supporting unit 18 are arranged without physical contact with each other, so that a gap 30 is defined between the direction shifting mechanism 24 and the sample tube supporting unit 18. The gap 30 will be described in detail further below.

The sample tube 28 in which a sample is housed is inserted into the insertion port 20, and transferred through the sample tube passage pipe 22 and the direction shifting mechanism 24 into the sample tube supporting unit 18 where a measurement is conducted. After completion of the measurement, the sample tube 28 is transferred from the sample tube supporting unit 18, and extracted through the direction shifting mechanism 24 and the sample tube passage pipe 22 from the insertion port 20. For extraction of the sample tube 28, a negative pressure is created within the sample tube supporting unit 18, the sample tube passage pipe 22, and the direction shifting mechanism 24 by suction from the negative pressure generator 26. The negative pressure causes the sample tube 28 supported within the sample tube supporting unit 18 to move through the direction shifting mechanism 24 and the sample tube passage pipe 22 to the insertion port 20 from which the sample tube 28 is extracted from the NMR probe 16 to the outside thereof.

The direction shifting mechanism 24 has a shape which partially includes a form of an arc, and the shape is designed to cause, when the sample tube 28 is transferred from the sample tube supporting unit 18 to the insertion port 20 and ejected from the insertion port 20, the sample tube 28 to be turned toward the insertion port 20 while being maintained in contact with at least two points on an inner wall of the direction shifting mechanism 24. The form of the arc includes a part of a curve obtained by transforming an astroid so as to be fitted to the magic angle.

Hereinafter, the form of the direction shifting mechanism 24 is described in detail.

Figure 3:
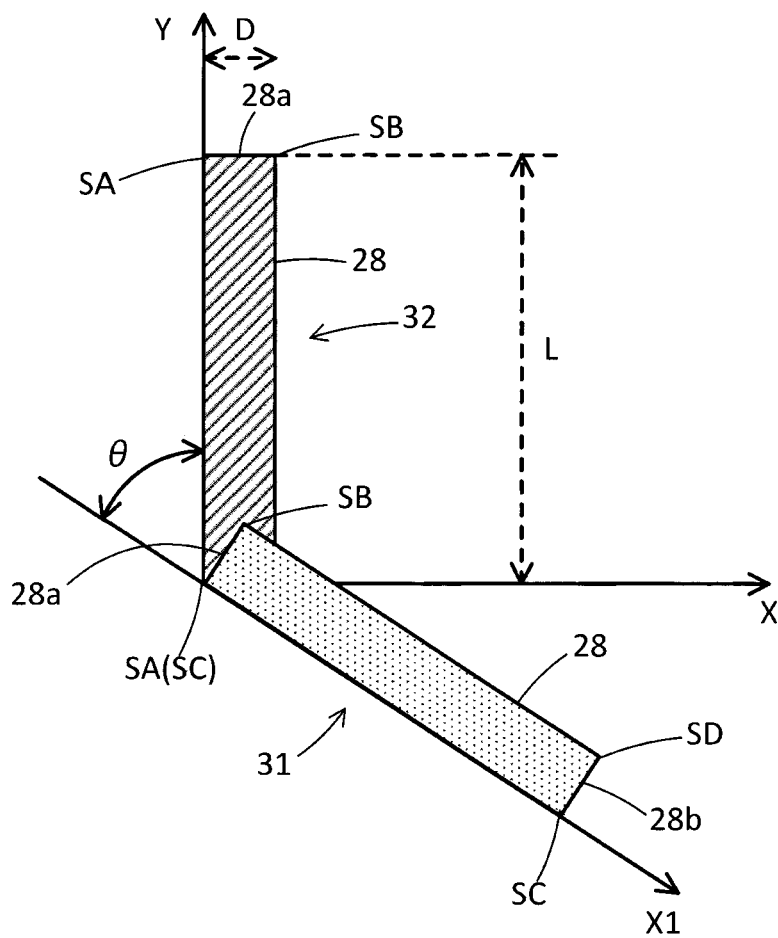
FIG. 3 shows a sample tube with an X axis and a Y axis.

FIG. 3 shows the sample tube 28 with an X axis and a Y axis. The X axis and the Y axis are orthogonal to each other. The Y axis extends in the vertical direction of the NMR apparatus 10 and in parallel to an extending direction of the sample tube passage pipe 22. In terms of a static magnetic field, the Y axis extends in parallel to a direction of the static magnetic field. The X axis extends in a direction orthogonal to the Y axis. FIG. 3 further shows an X1 axis which is inclined at a magic angle θ (of 54.7 degrees) relative to the Y axis.

The sample tube 28 is inclined at the magic angle θ in the sample tube supporting unit 18, and the direction shifting mechanism 24 has a space in which the orientation of the sample tube 28 inclined at the magic angle θ is turned so as to be in parallel to the vertical direction (a direction parallel to the Y axis). Here, a length L represents a length of the sample tube 28 (i.e., a longitudinal dimension of the sample tube 28) and a diameter D represents an outer diameter of the sample tube 28.

In a state of the sample tube 28 indicated by reference numeral 31, a moving direction of the sample tube 28 ejected from the sample tube supporting unit 18 is not shifted to the vertical direction by the direction shifting mechanism 24. In this state, the sample tube 28 is inclined at the magic angle θ, and the origin point (0, 0) of the X and Y axes is defined at a position of a vertex SA being one of the vertexes at a front end 28a of the sample tube 28 in the inclined state. Then, a vertex SC being one of the vertexes at a rear end 28b of the sample tube 28 in the inclined state has coordinates (L sin θ, L cos θ), and a vertex SD being the other of the vertexes at the rear end 28b has coordinates {(L sin θ+D cos θ), (L cos θ−D sin θ)}.

In a state of the sample tube 28 indicated by reference numeral 32, the moving direction of the sample tube 28 ejected from the sample tube supporting unit 18 has been shifted to the vertical direction by the direction shifting mechanism 24. In this state, the sample tube 28 is positioned in parallel to the Y axis; i.e., the vertical direction, and the vertex SA being the one of the vertexes at the front end 28a of the sample tube 28 has coordinates (0, L), while a vertex SB being the other of the vertexes at the front end 28a has coordinates (D, L). In addition, the vertex SC, the one of the vertexes at the rear end 28b has coordinates (0, 0), while the vertex SD, the other one of the vertexes at the rear end 28b has coordinates (D, 0).

Figure 4:
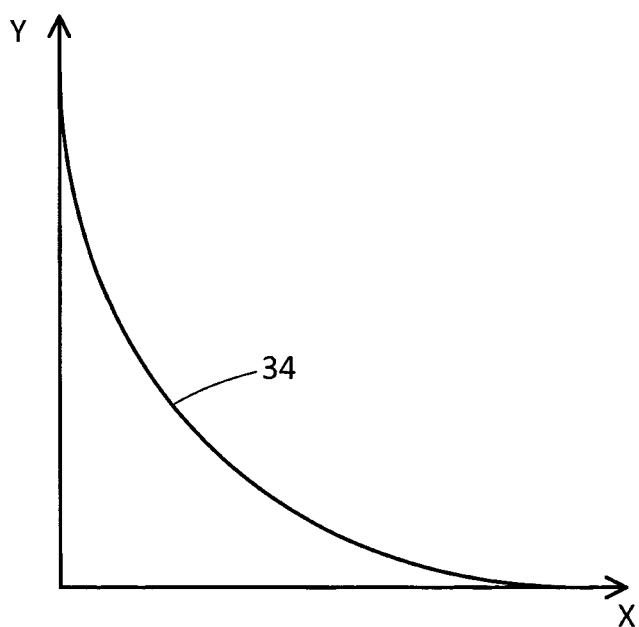
FIG. 4 shows an astroid.

FIG. 4 shows an astroid 34 plotted on a coordinate system defined by the X axis and the Y axis.

Figure 5:
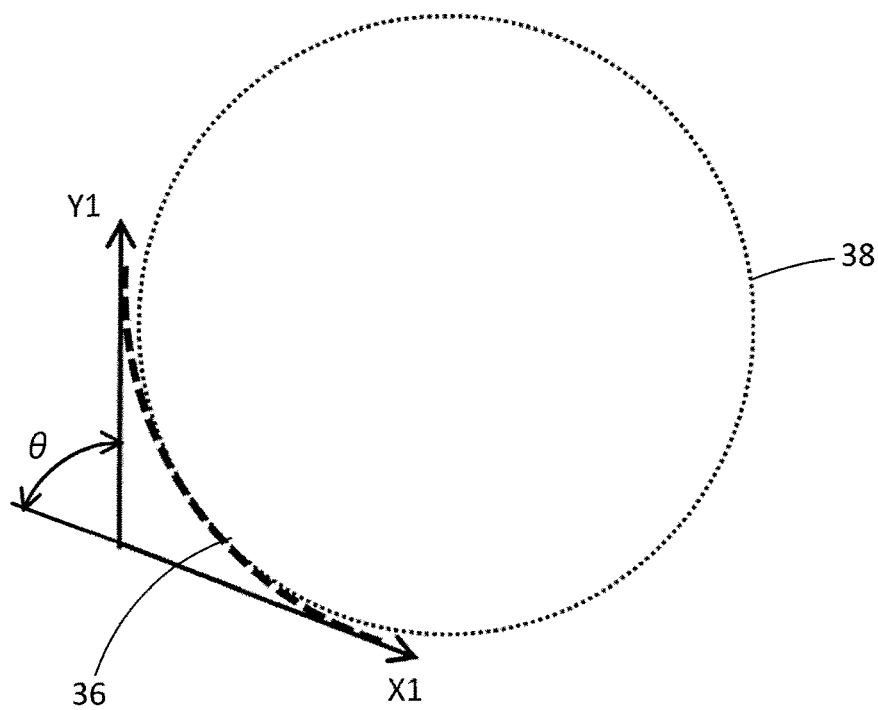
FIG. 5 shows a transformed astroid.

FIG. 5 shows a transformed coordinate system with an X1 axis and a Y1 axis that is transformed to be fitted to the magic angle θ. In the example shown in FIG. 5, the Y1 axis of the transformed coordinate system is identical to the Y axis (shown in FIGS. 3 and 4) of the coordinate system which is not transformed. On the other hand, the X1 axis of the transformed coordinate system is inclined at the magic angle θ with respect to the Y1 axis (=Y axis). A transformed astroid 36 illustrated in FIG. 5 is obtained by transforming the astroid 34 illustrated in FIG. 4 in accordance with coordinate transformation. That is, the X axis is inclined at the magic angle to form the X1 axis, and the astroid 34 is transformed in accordance with the coordinate transformation of the X axis to form the transformed astroid 36.

Ideally, it can be considered that when the direction of the sample tube 28 is shifted along the transformed astroid 36 in the direction shifting mechanism 24, a path required for shifting the direction of the sample tube 28 has a shortest length, and a space for transferring the sample tube 28 has a smallest volumetric size. There is, however, technical difficulty in manufacturing a passage pipe, through which the sample tube 28 is transferred, in a form of the astroid. To circumvent the difficulty, a circle approximated to the transformed astroid 36 (hereinafter referred to as an "approximate circle 38") is calculated, and the sample tube 28 is caused to change its direction along an arc contained in the approximate circle 38. This can shorten the path required for shifting the direction of the sample tube 28 to a shortest possible length, and can, in turn, minimize the volumetric size of the space for transferring the sample tube 28. As a calculation method, a well-known method may be employed to calculate the approximate circle 38 from the transformed astroid 36.

Figure 6:
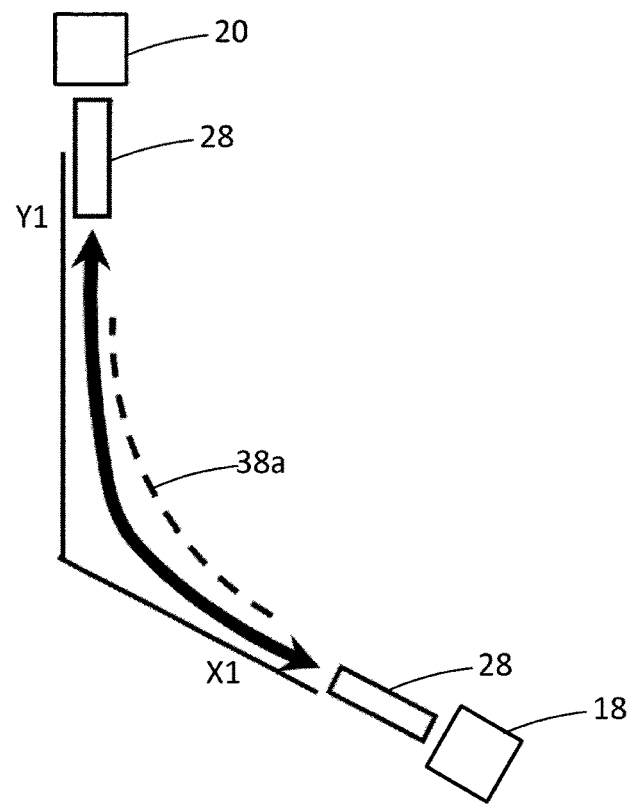
FIG. 6 is a diagram for explaining transfer of the sample tube.

FIG. 6 shows a manner of shifting the direction of the sample tube 28 by means of the direction shifting mechanism 24. In the example shown in FIG. 6, the direction shifting mechanism 24 is embodied as a passage including a form of an arc 38a which constitutes a segment of the above-described approximate circle 38. In operation to extract the sample tube 28, the sample tube 28 ejected from the sample tube supporting unit 18 is directed through the passage having the form of the arc 38a (i.e., the direction shifting mechanism 24) to the sample tube passage pipe 22, further directed through the sample tube passage pipe 22 to the insertion port 20, and extracted from the insertion port 20 to the outside of the NMR probe 16. In other words, the sample tube 28 moves along the arc 38a within the direction shifting mechanism 24.

In the configuration shown in FIG. 6, the direction of the sample tube 28 can be shifted through the passage including the form close to that of the transformed astroid 36, which can realize the possible shortest length of the path required for shifting the direction and thus the possible smallest volumetric size of the space through which the sample tube 28 is transferred.

Figure 7:
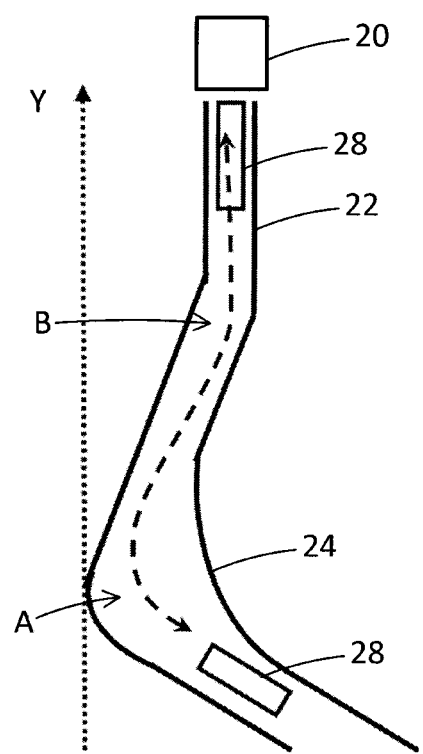
FIG. 7 is a diagram for explaining transfer of the sample tube.

However, the configuration shown in FIG. 6 needs a long distance between a position (on the X axis) of the sample tube 28 just ejected from the sample tube supporting unit 18 or a position (on the X axis) of the sample tube supporting unit 18 and a position (on the X axis) of the insertion port 20. Therefore, determination of the position of the insertion port 20 is subjected to the constraint of the long distance. FIG. 7 shows a scheme for reducing the distance. In the scheme shown in FIG. 7, after the sample tube 28 is moved along the arc 38a, the sample tube 28 is turned so as to be moved away from the Y axis. Because such a turn of the sample tube 28 reduces the above-described distance on the X axis, it becomes possible to bring the position of the insertion port 20 close to the sample tube supporting unit 18. In this case, the sample tube 28 must be turned twice (as indicated by reference signs A and B in FIG. 7).

Hereinafter, an arrangement capable of retaining compatibility between shortening the above-described distance and completing direction shifting of the sample tube 28 with a single turn will be described with reference to FIG. 8.

Figure 8:
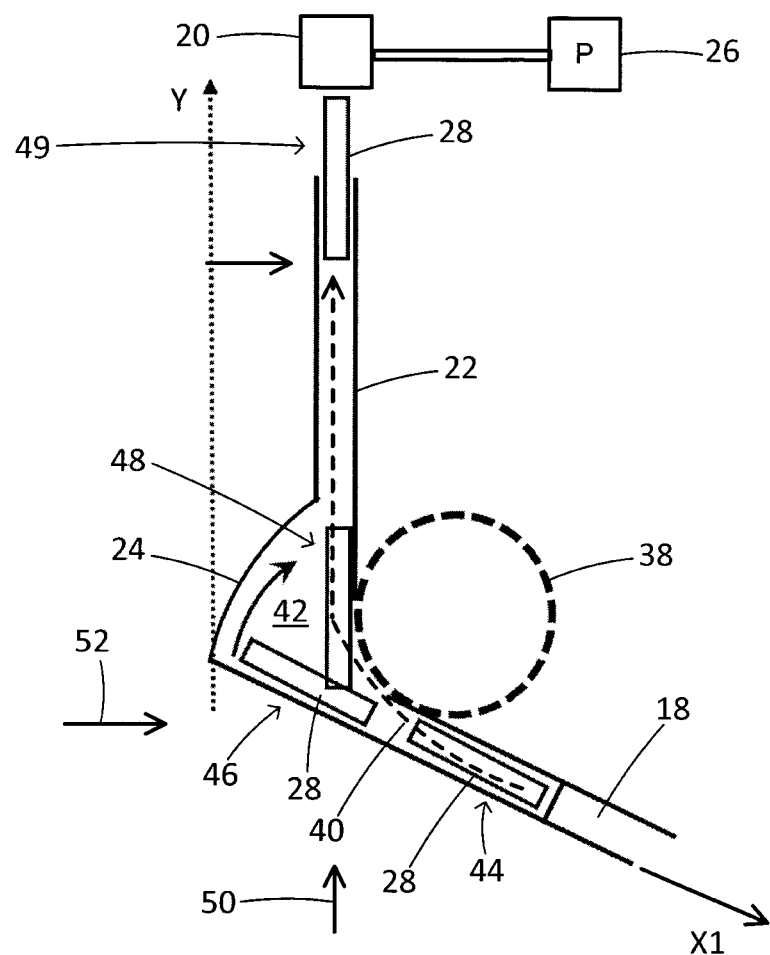
FIG. 8 shows a configuration of a direction shifting mechanism.

FIG. 8 shows a part of the sample tube supporting unit 18, the insertion port 20, the sample tube passage pipe 22, the direction shifting mechanism 24, the negative pressure generator 26, and the sample tube 28. Reference number 40 indicates a moving path of the sample tube 28. Inside the direction shifting mechanism 24, there is a space 42 required for shifting the direction of the cylinder axis of the sample tube 28 to the vertical direction (i.e., the direction parallel to the Y axis) (i.e., changing the orientation of the sample tube 28 to an orientation parallel to the vertical direction). When the negative pressure generator 26 produces the negative pressure within the sample tube passage pipe 22 and the direction shifting mechanism 24, the sample tube 28 supported by the sample tube supporting unit 18 is sucked up toward the insertion port 20.

Reference numerals 44, 46, 48, and 49 indicate positions of the sample tube 28 situated in various stages. Specifically, reference numeral 44 indicates the sample tube 28 in a stage immediately after ejection from the sample tube supporting unit 18. Reference numeral 46 indicates the sample tube 28 in a stage of arrival at the space 42 and before shifting of the direction. Here, the sample tube 28 in the stage indicated by reference numeral 46 is inclined at the magic angle $\theta$ relative to the Y axis. Reference 48 indicates the sample tube 28 in a stage after the shifting of the direction to the vertical direction by the direction shifting mechanism 24. Reference numeral 49 indicates the sample tube 28 in a stage of arrival at a location close to the insertion port 20 after passing through the sample tube passage pipe 22.

The space 42 defined within the direction shifting mechanism 24 has a lateral dimension sufficient to accommodate the sample tube 28 along a direction parallel to an axis of the sample tube supporting unit 18 (the direction parallel to the X1 axis); i.e., the lateral dimension corresponding to the length of the sample tube 28 in the stage indicated by reference numeral 46, and has a vertical dimension sufficient to accommodate the sample tube 28 along the vertical direction (i.e., the direction parallel to the Y axis); i.e., the vertical dimension corresponding to the length of the sample tube 28 in the stage indicated by reference numeral 48. Further, the space 42 includes, in the X axis direction, a direction shifting area where the orientation of the sample tube 28 (i.e., the position of the sample tube 28) can be changed between the two stages indicated by reference numerals 46 and 48.

FIG. 8 further shows the approximate circle 38. The inside of the direction shifting mechanism 24 partially has the form of an arc constituting a segment of the approximate circle 38 (such as, for example, the arc 38a illustrated in FIG. 6). When the sample tube 28 is drawn up by suction from the negative pressure generator 26, the sample tube 28 is caused to move through the inside of the direction shifting mechanism 24 along the arc from the location in the stage indicated by reference numeral 44 to the location in the stage indicated by reference numeral 46. In other words, the sample tube 28 moves in the inside of the direction shifting mechanism 24 along the inner wall thereof having the form of the arc. While the sample tube 28 is moving along the arc in the space 24, the direction of the cylinder axis of the sample tube 28 is changed to the vertical direction (i.e., the orientation of the sample tube 28 is aligned with the vertical direction) (see the state indicated by reference numeral 48). In this state, the sample tube 28 is sucked up through the sample tube passage pipe 22 along the vertical direction to the insertion port 20.

In operation to insert the sample tube 28 from the insertion port 20 into the NMR probe 16, the above-described movement of the sample tube 28 is reversed. Specifically, the direction of the cylinder axis of the sample tube 28 is shifted from the vertical direction to a direction inclined at the magic angle $\theta$ (i.e., the orientation of the sample tube 28 is inclined), and in this inclined state, the sample tube 28 is moved into the sample tube supporting unit 18.

The position of the insertion port 20 can be changed by changing the position and size of the approximate circle 28. Even in a case where the approximate circle 28 is reduced in size, the sample tube 28 is also moved, in the inside of the direction shifting mechanism 24, along the inner wall having the form which partially matches the approximate circle 38 whose size is reduced. As the approximate circle 38 becomes smaller, the position of the direction shifting mechanism 24 can be located, on the X axis, closer to the sample tube supporting unit 18. As a result, the sample tube passage pipe 22 connected to the direction shifting mechanism 24 and thus the insertion port 20 connected to the sample tube passage pipe 22 can be accordingly brought closer, on the X axis, to the sample tube supporting unit 18. In this way, the distance between the position (on the X axis) of the sample tube supporting unit 18 and the position (on the X axis) of the insertion port 20 can be shortened.

In addition, when the sample tube 28 is moved along the arc constituting a part of the approximate circle 38, the direction of the cylinder axis of the sample tube 28 can be shifted (i.e., the orientation of the sample tube 28 becomes parallel) to the vertical direction, and the sample tube 28 is subsequently moved through the sample tube passage pipe 22 and ejected from the insertion port 20 to the outside of the NMR probe 16. In this way, extraction of the sample tube 28 from the insertion port 20 to the outside of the NMR probe 16 can be achieved with the single turn. In the structure illustrated in FIG. 7, the sample tube 28 is required to make the turn twice, whereas the second turn is not needed in the structure illustrated in FIG. 8 in which the sample tube 28 can be extracted from the insertion port 20 to the outside through the single turn. When the number of turns of the sample tube 28 is reduced, the volumetric size of the entire space required for shifting the direction can be accordingly minimized.

Figure 9:
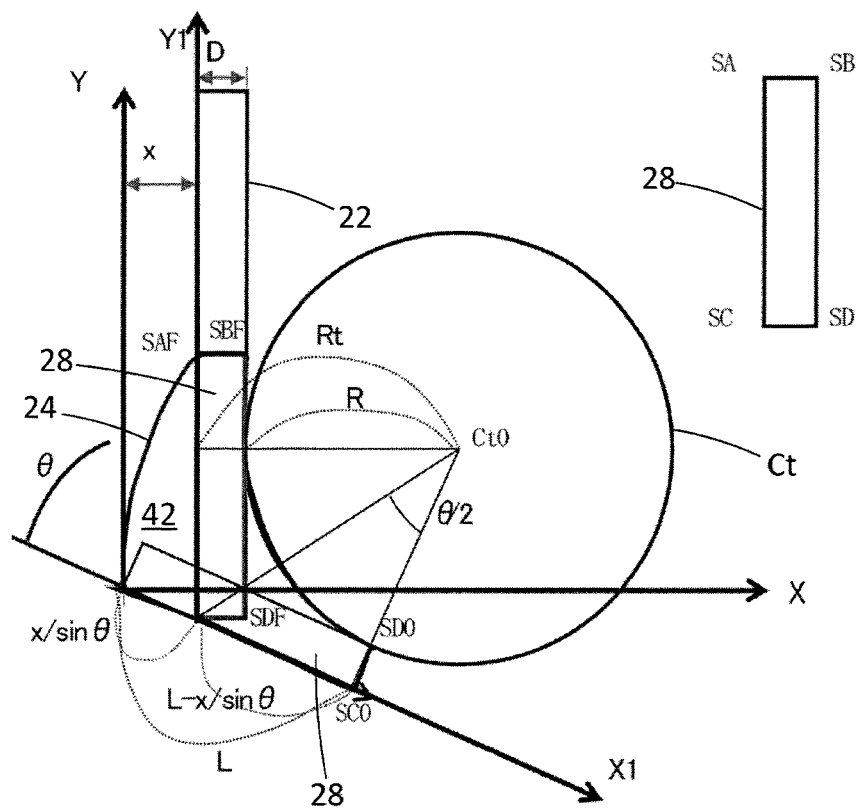
FIG. 9 shows the configuration of the direction shifting mechanism.
Figure 10:
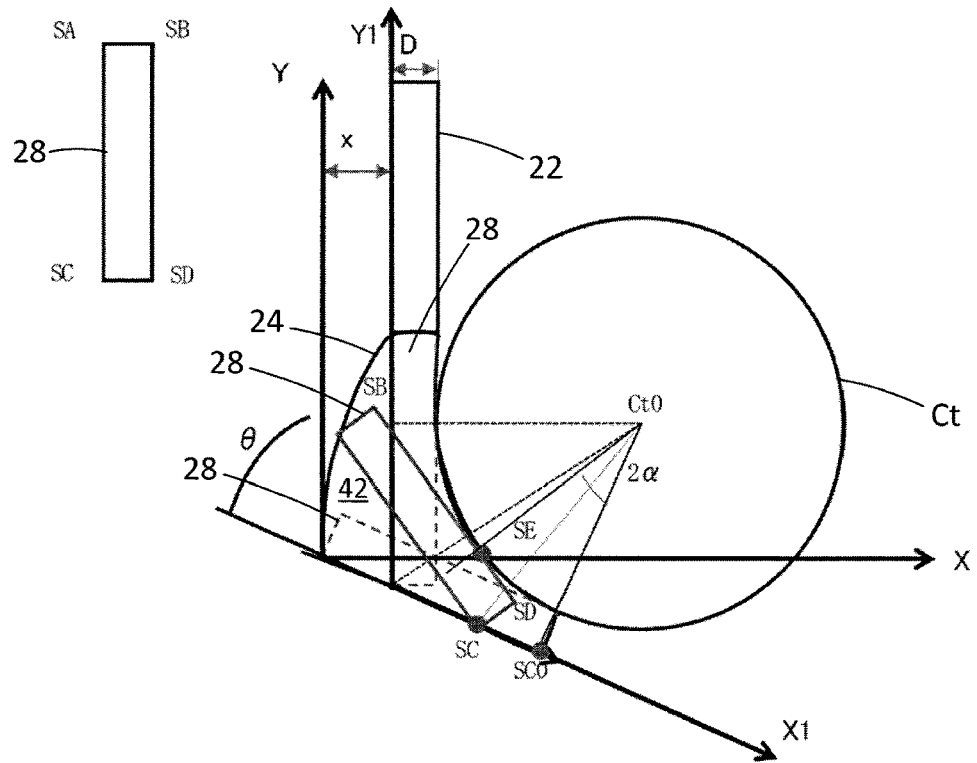
FIG. 10 shows the configuration of the direction shifting mechanism.

Hereinafter, the structure of the direction shifting mechanism 24 is described in further detail with reference to FIGS. 9 and 10. In particular, the space 42 is elaborately explained. FIGS. 9 and 10 show the Y axis, the Y1 axis, the X axis, the X1 axis, the sample tube passage pipe 22, the space 42 within the direction shifting mechanism 24, the sample tube 28, and a circle Ct.

A variable x is a value which determines the position of the insertion port 20. As described above, the length L represents the length of the sample tube 28, the diameter D represents the outer diameter of the sample tube 28, and an angle θ is the magic angle.

The variable x satisfies a condition expressed by equation (1) as follows:

$$x < x\_limit \quad (1)$$

where $x\_limit = L \sin\theta + D(\cos\theta - 1)$.

Here, the X1 axis having the magic angle θ is considered.

Both the X1 axis and the Y1 axis are of the transformed coordinate system. The X1 axis is inclined at the magic angle θ relative to both the Y axis and the Y1 axis. In a rectangular coordinate system defined by the X axis and the Y axis, the X1 axis is plotted so as to be inclined at the magic angle θ relative to the Y axis. A coordinate system defined by the Y axis and the X1 axis is slid by a distance x with respect to the X axis, to thereby obtain a coordinate system with the Y1 axis and the X1.

The sample tube 28, which is placed along the X1 axis with the vertex SA of the sample tube 28 being overlaid with the origin of the (X axis, Y axis) coordinate system, is in a position where the sample tube 28 is, in operation to extract the sample tube 28, just ejected from the sample tube supporting unit 18 and is introduced into the direction shifting space 42. The vertices SA, SB, SC, and SD located in the above-described position are defined as vertices SA0, SB0, SC0, and SD0, respectively.

As described above, the direction of the sample tube 28 is shifted to the vertical direction within the space 42. The vertices SA, SB, SC, and SD located in a shifted position are defined as vertices SAF, SBF, SCF, and SDF, respectively. Further, the vertex SCF is placed at the origin of the (X1 axis, Y1 axis) coordinate system.

Here, the virtual circle Ct is defined. The virtual circle Ct corresponds to the above-described approximate circle 38. Specifically, the circle Ct is such a circle that the vertex SD0 of the sample tube 28 is brought into contact with the circle Ct when the sample tube 28 enters the space 42 and in the stage before the direction shifting of the sample tube 28, and after the direction of the sample tube 28 is shifted within the space 42, a line segment (SBF-SDF) of the sample tube 28 is tangent to the circle Ct. Further, the center of the circle Ct is defined as Ct0.

The radius R of the circle Ct is expressed by equation (2) as follows:

$$R = (L - x/\sin\theta)\tan(\pi/2 - \theta/2) - D \quad (2)$$

based on $Rt = (L - x/\sin g\theta) \tan(\pi/2 - \theta/2)$
where Rt is a distance of the center Ct0 from the Y1 axis.

Movement of the sample tube 28 making a turn to change the direction of the cylinder axis of the sample tube 28 (i.e., the orientation of the sample tube 28) within the space 42 is described below. Here, paths which are traced by the vertices SA, SB, SC, and SD of the sample tube 28 when the sample tube 28 is turned are defined as moving paths CSA, CSB, CSC, and CSD, respectively. During the turn of the sample tube 28 within the space 42, the vertex SC always moves on the X1 axis to the origin of the X1 axis, and a line segment (SB-SD) on the sample tube 28 is always tangent to the circle Ct. That is, the sample tube 28 makes the turn in a state where the line segment (SB-SD) on the sample tube 28 maintains in contact with the circle Ct while the vertex SC is moving on the X1 axis to the origin of the X1 axis. The moving path of the vertex SC on the X1 axis constitutes a part of the inner wall of the direction shifting mechanism 24 while a portion of the circle Ct contacted by the line segment (SB-SD) constitutes another part of the inner wall of the direction shifting mechanism 24. In this way, at least two points (i.e., the vertex SC and a point on the line segment (SB-SD)) on the sample tube 28 are maintained in contact with the inner wall of the direction shifting mechanism 24 when the direction of the sample tube 28 is shifted in the direction shifting mechanism 24. That is, the direction shifting mechanism 24 has the shape which causes the sample tube 28 to be turned toward the insertion port 20 while maintaining the sample tube 28 in contact with at least two points on the inner wall formed in the arc shape. The position of the vertex SC of the sample tube 28 which is arrived at the Y axis in the untransformed coordinate system; i.e., the position of the vertex SC of the sample tube 28 whose vertex SA is located at the origin ((X, Y)=(0, 0)) of the coordinate system defined by the X axis and the Y axis is the position of the vertex SC0.

A point of contact between the circle Ct and the sample tube 28 being turned is defined as a contact SE (see FIG. 10). An angle formed by a line segment connecting the contact SE and the center Ct0 and a line segment connecting the vertex SC0 and the center Ct0 is defined as an angle 2α.

During the turn of the sample tube 28, an angle α changes in a range of $0 < \alpha < (\theta/2)$.

The path CSA of the vertex SA and the path CSB of the vertex SB during the turn of the sample tube 28 are expressed by equation (3) as follows:

$$CSA(X,Y)=(L \sin \theta-(L-x/\sin \theta)\tan(\pi/2-\theta/2)\tan \alpha \sin \theta-L \sin(\theta-2\alpha),-\{L \cos \theta-(L-x/\sin \theta)\tan(\pi/2-\theta/2)\tan \alpha \cos \theta-L \cos(\theta-2\alpha)\})$$

$$CSB(X,Y)=(L \sin \theta-\{(L-x/\sin \theta)\tan(\pi/2-\theta/2)-D\}\tan \alpha \sin \theta-(L-D \tan \alpha)\sin(\theta-2\alpha)+D \sin(\pi/2-\theta),-\{L \cos \theta-\{(L-x/\sin \theta)\tan(\pi/2-\theta/2)-D\}\tan \alpha \cos \theta-(L-D \tan \alpha)\cos(\theta-2\alpha)\}+D \cos(\pi/2-\theta)) \quad (3)$$

In the above equation (3), x/L is a variable, and each of the paths can be found by actually moving the sample tube 28.

The space 42 can be formed in the shape conforming the above-described paths by manufacturing the direction shifting mechanism 24 based on the paths. Here, the paths may be approximated to a circle, to thereby simplify the shape of the space 42.

The direction shifting mechanism 24 according to this embodiment can allow the sample tube 28 to be extracted from the NMR probe 16 through the single turn. As in the case of the extraction, the sample tube 28 introduced from the insertion port 20 can be transferred into the sample tube supporting unit 18 through the single turn.

In addition, the position of the insertion port 20 can be brought closer to the sample tube supporting unit 18 with respect to the X axis by scaling down the approximate circle 38 and designing the direction shifting mechanism 24 so as to have the size and shape conforming to the scaled-down approximate circle 38 as shown in FIG. 8. As a result, because the distance between the insertion port 20 and the sample tube supporting unit 18 on the X axis can be shortened, the direction shifting mechanism 24 according to this embodiment can be installed in NMR probes, such as narrow bore probes, that are subject to spatial constraints.

In addition, when the direction of the sample tube 28 is shifted by the direction shifting mechanism 24 according to this embodiment in operation to extract the sample tube 28, the sample tube 28 ejected from the sample tube supporting unit 18 can be turned while preventing the front end 28a of the sample tube 28 from being brought into contact with the inner wall of the direction shifting mechanism 24; in other words, without a collision between the front end 28a and the inner wall. The front end 28a is equipped with a turbine blade for rotating the sample tube 28. Preventing the front end 28a from colliding against the inner wall can, in turn, prevent the turbine blade from getting damaged.

Meanwhile, the sample tube 28 is sucked up by means of the negative pressure generator 28, which can eliminate the need to supply the direction shifting mechanism 24 with gas for shifting the direction of the sample tube 28. For this reason, there is no need to arrange a blowoff port for supplying the gas. Further, because no gas is supplied, the atmosphere within the sample tube supporting unit 18 can be maintained.

On the other hand, a gas, such as air, nitrogen, or helium, is used for rotation and temperature control of the sample tube 28. When a suction scheme by means of the negative pressure generator 26 is employed, a loss of the gas becomes smaller than a loss caused when other schemes are employed, which can, in turn, reduce the consumption of gas. In addition, because no gas is used for ejecting the sample tube 28, a change in temperature occurring within the NMR probe 16 due to the operation to replace the sample tube 28 can be suppressed.

Meanwhile, a gas may be supplied into a region of the passage close to a location where the sample tube 28 ejected from the sample tube supporting unit 18 is initially brought into contact with the passage, to thereby aid the turn of the sample tube 28. For example, in operation to extract the sample tube 28, the gas may be ejected toward the sample tube 28 from below the sample tube 28 as indicated by an arrow 50 in FIG. 8, to assist the turning of the sample tube 28. Further, in operation to introduce the sample tube 28 through the insertion port 20 toward the sample tube supporting unit 18, the gas may be ejected toward the sample tube 28 as indicated by an arrow 52 along the direction of the X axis, to thereby assist the turning of the sample tube 28.

Hereinafter, the gap 30 formed between the direction shifting mechanism 24 and the sample tube supporting unit 18 is described.

The direction shifting mechanism 24 is connected to the sample tube passage pipe 22, and the sample tube passage pipe 22 is connected to an external component installed outside of the NMR probe 16. Here, assuming that the direction shifting mechanism 24 is connected to the sample tube supporting unit 18, it becomes necessary for the external component installed outside the NMR probe 16 to be moved together with the direction shifting mechanism 24 and the sample tube supporting unit 18 in an interlocked manner. Further, in such an assumed case where the direction shifting mechanism 24 is connected to the sample tube supporting unit 18, it is also necessary that the external component installed outside the NMR probe 16 be moved in the interlocked manner when the inclination of the sample tube supporting unit 18 is adjusted to the magic angle θ. It is further necessary that any component arranged in a region where the sample tube 28 passes through be composed of a flexible member, which places limitations on available materials. For example, rubber based materials cannot be used in an environment having temperatures other than room temperature.

The above-described problematic necessity or limitations can be eliminated by separating the sample tube supporting unit 18 from the direction shifting mechanism 24 with the gap 30 formed therebetween. That is, because the sample tube supporting unit 18 is not connected to the direction shifting mechanism 24, there is no need to move either the sample tube passage pipe 22 or the direction shifting mechanism 24 in the first place. Further, because the sample tube supporting unit 18 is separated from the direction shifting mechanism 24, there is no need to move the direction shifting mechanism 24 and the sample tube passage pipe 22 when the inclination of the sample tube supporting unit 18 is adjusted to the magic angle θ.

For example, when the sample tube 28 having the outer diameter from approximately 3.2 mm to approximately 4 mm is transferred through a passage having an inner diameter (bore size) of 5 mm, a distance across the gap 30 may be set in a range from approximately 0.01 mm to approximately 0.8 mm. As the distance across the gap 30 increases, the sample tube 28 is less prone to be transferred properly, and thus a higher differential pressure is required for transferring the sample tube 28. The differential pressure is obtained from the negative pressure produced by the negative pressure generator 26. It should be noted that in a case where a pressure is applied to the sample tube 28 from therebehind by means of a compressor for extracting the sample tube 28 through the insertion port 20, the differential pressure is created by the compressor.

When the sample tube 28 is transferred through the sample tube passage pipe 22, the direction shifting mechanism 24, and the gap 30 (i.e., over the entire path), the presence of a clearance of approximately 0.2 mm to approximately 1.0 mm around the sample tube 28 may facilitate the transfer of the sample tube 28. When the clearance is formed, the sample tube 28 can be smoothly transferred throughout the path. For example, when the sample tube supporting unit 18 is placed to match the position of the direction shifting mechanism 24, smooth transfer of the sample tube 28 between the sample tube supporting unit 18 and the direction shifting mechanism 24 can be achieved.

A component used for bordering the gap 30 may be composed of flat plates arranged in parallel to each other, a circular member arranged about a rotation axis of the sample tube supporting unit 18, or a labyrinth seal.

The direction shifting mechanism 24 is formed of a material, such as a metal, a ceramic based material, or a resin, for example.

As the metal, coppers having a hardness (N/mm$^2$) corresponding to 40 to 310 HV may be used.

The ceramic based material may be, for example, zirconia, alumina, silicon nitride, or silicon carbide, that can be polished so as to have surface roughness of Ra 1.6 μm or lower. Further, ceramic based materials having a hardness of 840 to 3000 HV are used.

As the resin, for example, a fluoroplastic, such as PCTFE or PTFE, a polyimide resin, such as PEEK or VESPEL (registered trademark), or the like is used.

When the above-described material is used, the sample tube supporting unit 18 can be prevented from getting tensioned due to contraction or expansion when the NMR probe 16 is cooled or heated, which can, in turn, ensure that the angle of the sample tube supporting unit 18 can be adjusted to the magic angle in a stable manner.

The invention claimed is:

1. A nuclear magnetic resonance (NMR) probe, comprising:
   a sample tube supporting unit configured to support, during an NMR measurement, a sample tube used for the NMR measurement;
   an insertion port through which the sample tube is introduced into or extracted from the sample tube supporting unit; and
   a direction shifting mechanism through which the sample tube is directed, the direction shifting mechanism being disposed between the sample tube supporting device and the insertion port in a path of the sample tube, and having a shape which partially includes a form of an arc;
   wherein the shape of the direction shifting mechanism is configured to cause the sample tube to change an orientation thereof in such a manner that the sample tube is turned toward the insertion port along the arc while being maintained in contact with at least two points on an inner wall of the direction shifting mechanism when the sample tube is directed from the sample tube supporting unit to the insertion port and extracted therefrom,
   wherein the direction shifting mechanism is configured to change the orientation of the sample tube toward the insertion port with a side face of the sample tube maintained in contact with the arc, and
   wherein the arc is formed on a face opposite a face that defines a magic angle relative to a static magnetic field in the direction shifting mechanism.

2. The NMR probe according to claim 1, further comprising:
   a device configured to draw the sample tube by suction from the sample tube supporting unit toward the insertion port for extracting the sample tube from the insertion port.

3. The NMR probe according to claim 1, wherein:
   the sample tube supporting unit is configured to support the sample tube in a state of being inclined at the magic angle relative to the static magnetic field; and
   the form of the arc includes a part of a transformed astroid being fitted to the magic angle.

4. The NMR probe according to claim 3, wherein:
   the insertion port is arranged at a location shifted toward the sample tube supporting unit from a location of a front end of the sample tube being completely extracted from the sample tube supporting unit.

5. The NMR probe according to claim 1, wherein:
   the direction shifting mechanism and the sample tube supporting unit are installed without being connected to each other, to thereby form a gap between the direction shifting mechanism and the sample tube supporting unit.

* * * * *